(12) United States Patent
Lai et al.

(10) Patent No.: US 7,754,545 B2
(45) Date of Patent: Jul. 13, 2010

(54) SEMICONDUCTOR DEVICE AND METHOD OF FABRICATING THE SAME

(75) Inventors: Erh-Kun Lai, Taichung County (TW); Yen-Hao Shih, Changhua County (TW)

(73) Assignee: Macronix International Co., Ltd., Hsinchu (TW)

(*) Notice: Subject to any disclaimer, the term of this patent is extended or adjusted under 35 U.S.C. 154(b) by 123 days.

(21) Appl. No.: 11/949,090

(22) Filed: Dec. 3, 2007

(65) Prior Publication Data
US 2009/0140321 A1  Jun. 4, 2009

(51) Int. Cl.
*H01L 21/339* (2006.01)
*H01L 21/84* (2006.01)
(52) U.S. Cl. .................. 438/153; 438/154; 438/188; 438/199; 438/203; 438/287
(58) Field of Classification Search ............... 438/153, 438/154, 188, 199, 203, 287
See application file for complete search history.

(56) References Cited

U.S. PATENT DOCUMENTS 6,432,776 B1 * 8/2002 Ono ..................... 438/275
2005/0110102 A1  5/2005 Wang et al.
2005/0214996 A1 * 9/2005 Yoshino ................. 438/197
2008/0064171 A1 * 3/2008 Jang et al. .............. 438/287

FOREIGN PATENT DOCUMENTS

CN  1404114  3/2003

OTHER PUBLICATIONS

English language translation of abstract of CN 1404114 (published Mar. 19, 2003).

* cited by examiner

*Primary Examiner*—Long K Tran
(74) *Attorney, Agent, or Firm*—Thomas, Kayden, Horstemeyer & Risley

(57) ABSTRACT

A semiconductor device and a method of fabricating the same are provided. First, a first oxide layer and a nitride layer are formed on a base having a first region and a second region. Next, the nitride layer is oxidized. A part of nitride in the nitride layer moves to the first oxide layer and the base. An upper portion of the nitride layer is converted to an upper oxide layer. Then, the upper oxide layer, the nitride layer and the first oxide layer in the second region are removed. Thereon, a second oxide layer is grown on the base in the second region. Nitride in the second region moves to the second oxide layer.

24 Claims, 5 Drawing Sheets

100

SEMICONDUCTOR DEVICE AND METHOD OF FABRICATING THE SAME

BACKGROUND OF THE INVENTION

1. Field of the Invention

The invention relates in general to a semiconductor device and a method of fabricating the same, and more particularly to a semiconductor device subjected to a nitridation process and a method of fabricating the same.

2. Description of the Related Art

As the digital era progresses, the demand for data memory medium is increased gradually. Therefore, the trend of the semiconductor technology in fabricating memory medium is continuously developed toward mass production at low cost.

Among data memory medium fabricated by semiconductor technology, non-volatile memory (NVM) which does not need electricity to maintain the data memory status is widely applied. Non-volatile memory can be sorted into one-time programmable memory and multiple-time programmable memory. A one time programmable memory can be exemplified by a basic input/output system (BIOS) or a mask read-only memory (MROM), and a multiple-time programmable memory can be exemplified by a flash memory. In the fabricating process of an one time programmable memory, data is permanently written into the circuit of the memory. Once the memory is complete, the memory can only be read but can not be reprogrammed or erased. As for a multi-time programmable memory, programming, erasing or reading process is performed by providing voltage, that is, data stored in the multiple-time programmable memory can be reprogrammed or erased accordingly. In light of the conveniences of the multiple-time programmable memory, various consumer electronic products now take the multiple-time programmable memory as the medium for storage.

Commonly, a metal-oxide-semiconductor (MOS) structure including a gate stack, a charge storage layer and a base is used in the non-volatile memory cell. The base has a drain region and a source region at two sides of the gate stack. The carriers are accumulated in or removed from the charge storage layer by a strong electric field generated by applying different voltages to the gate, the drain, the source and the base of the memory, and thus data stored in the memory is changed. During erasing, carriers are removed from the charge trapping layer; during programming, carriers are accumulated in the charge trapping layer.

In the conventional non-volatile memory, the circuits of a cell region and a peripheral region are integrated. A logic device, such as a complementary metal oxide semiconductor (CMOS), is generally disposed in the peripheral region. However, due to the highly sophisticated fabricating process of the cell and the incompatibility of the fabricating processes of the cell and the CMOS, it is difficult to simplify the fabricating steps of the memory. Also, the fabricating time and cost can not be reduced as well.

SUMMARY OF THE INVENTION

The invention is directed to a semiconductor device and a method of fabricating the same. A logic device including a first oxide layer and a non-volatile memory device including a second oxide layer are formed on a base at the same time through one integrated process. The logic device and the non-volatile memory device respectively have different parts of nitride with different arrangement for improving the strength of a gate oxide layer of the logic device, durability of the logic device and data retention property of the non-volatile memory device. Furthermore, fabricating steps are integrated for simplifying the manufacturing process, and the fabricating cost and time are both reduced.

According to one aspect of the present invention, a method of fabricating a semiconductor device is provided. First, a first oxide layer and a nitride layer are formed on a base. The base has a first region and a second region. Next, the nitride layer is oxidized. A part of nitride in the nitride layer moves to the first oxide layer and the base. An upper portion of the nitride layer is converted to an upper oxide layer. Then, the upper oxide layer, the nitride layer and the first oxide layer in the second region are removed. Further, a second oxide layer is grown on the base in the second region. Nitride in the second region moves to the second oxide layer.

According to another aspect of the present invention, a semiconductor device is provided. The semiconductor device includes a base, a first oxide layer and a second oxide layer. The base has a first region and a second region. The first oxide layer is disposed on the base in the first region. The second oxide layer is disposed on the base in the second region. The first oxide layer has a first part of nitride therein. The base has a second part of nitride located near an interface between the base and the first oxide layer. The second oxide layer has a third part of nitride therein.

The invention will become apparent from the following detailed description of the preferred but non-limiting embodiments. The following description is made with reference to the accompanying drawings.

DETAILED DESCRIPTION OF THE INVENTION

Figure 1:
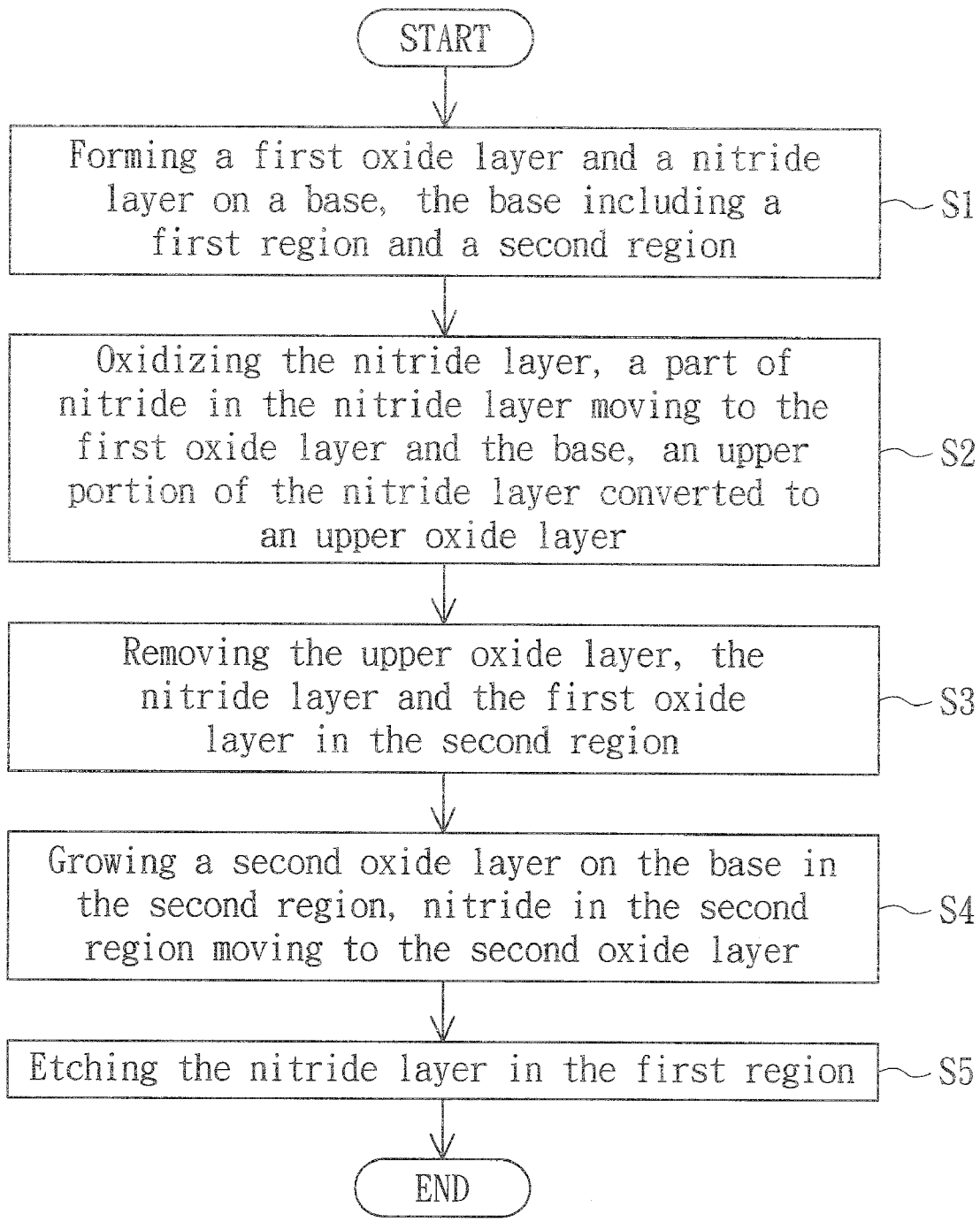
FIG. 1 is a flow chart of a method of fabricating a semiconductor device according to a preferred embodiment of the present invention.

In a method of fabricating a semiconductor device according to a preferred embodiment of the present invention, a logic device and a non-volatile memory device are formed at the same time through an integrated processing. The arrangement of nitride in the logic device is different from that in the non-volatile memory device. A CMOS and a nitride non-volatile memory device are formed integrally in the present embodiment. However, the present invention is not limited thereto, and the following preferred embodiment does not limit the scope of the protection of the present invention. Furthermore, unnecessary components are omitted in the drawings to clearly show the features of the present embodiment.

Please refer to FIG. 1 and FIGS. 2A~2I. FIG. 1 is a flow chart of a method of a fabricating a semiconductor device according to a preferred embodiment of the present invention. FIGS. 2A~2I are cross-sectional views of the semiconductor device respectively corresponding to the steps in FIG. 1. First, as shown in step S1 and FIG. 2A, a first oxide layer 21 and a nitride layer 30 are sequentially formed on a base 10. The base 10 has a first region R1 and a second region R2. In the present embodiment, the base 10 is exemplified by a silicon base. The first oxide layer 21 covers the base 10, and the nitride layer 30 covers the first oxide layer 21. For example, the first oxide layer 21 is formed by thermal oxidizing the base 10, and the thickness of the first oxide layer 21 is substantially 5~100 Å (angstrom). The nitride layer 30 is preferably deposited on the first oxide layer 21 and has nitride 40 therein, which can be exemplified by nitrogen or nitride silicon ($SiN_x$).

Figure 2A:
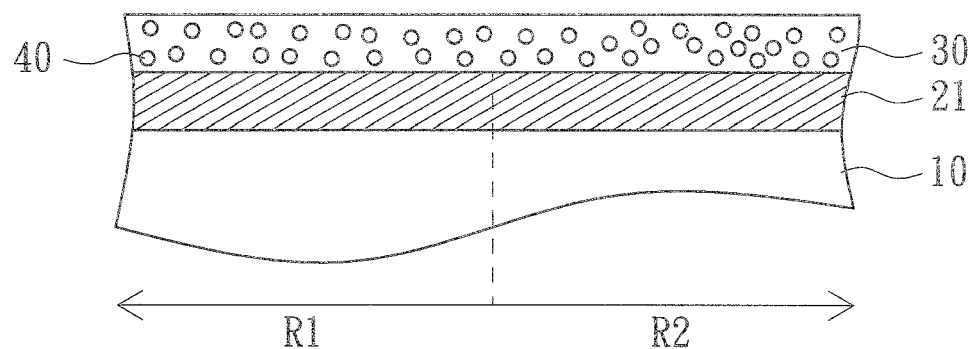
FIGS. 2A~2I are cross-sectional views of the semiconductor device respectively corresponding to the steps in FIG. 1.
Figure 2B:
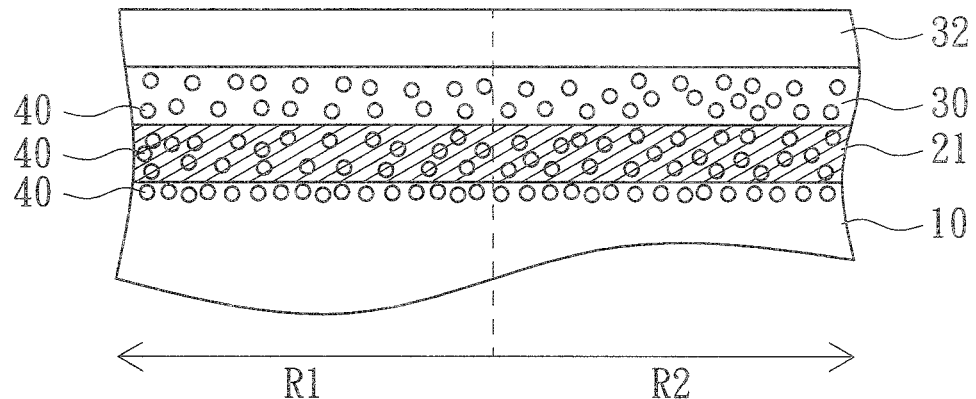

Next, in step S2, the nitride layer 30 is oxidized. In the present embodiment, the nitride layer 30 is oxidized through a high-temperature thermal process. For example, the thermal process is performed at a high temperature between 800~1200° C. for 0.5~2 hours. As shown in FIG. 2B, while oxidizing the nitride layer 30, a part of nitride 40 in the nitride layer 30 moves to the first oxide layer 21, and further passes through the first oxide layer 21 and reaches the base 10. Nitride 40 in the base 10 is preferably located near the interface between the base 10 and the first oxide layer 21. In step S2, an upper portion of the nitride layer 30 is converted to an upper oxide layer 32. The upper oxide layer 32 is provided by forming a silicon dioxide layer for example, and the thickness is substantially equal to or less than 100 Å.

Figure 2C:
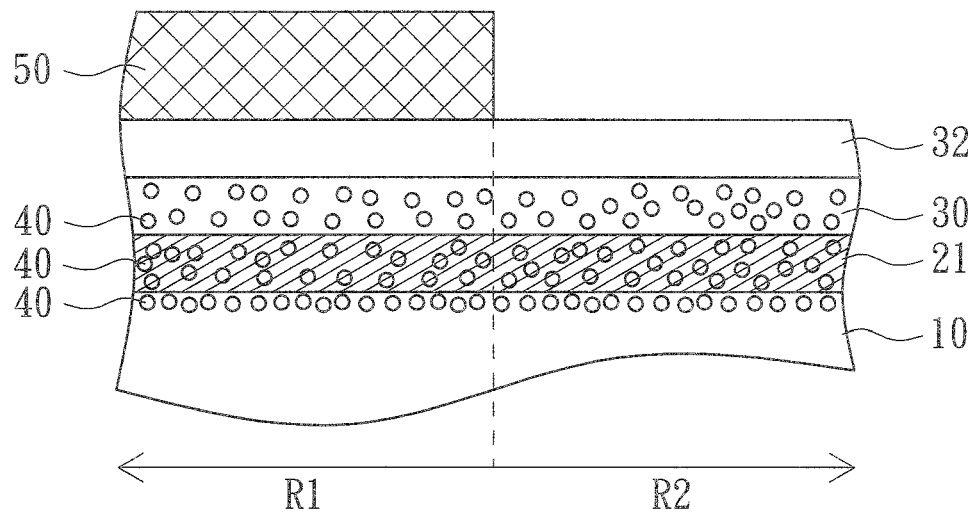
Figure 2D:
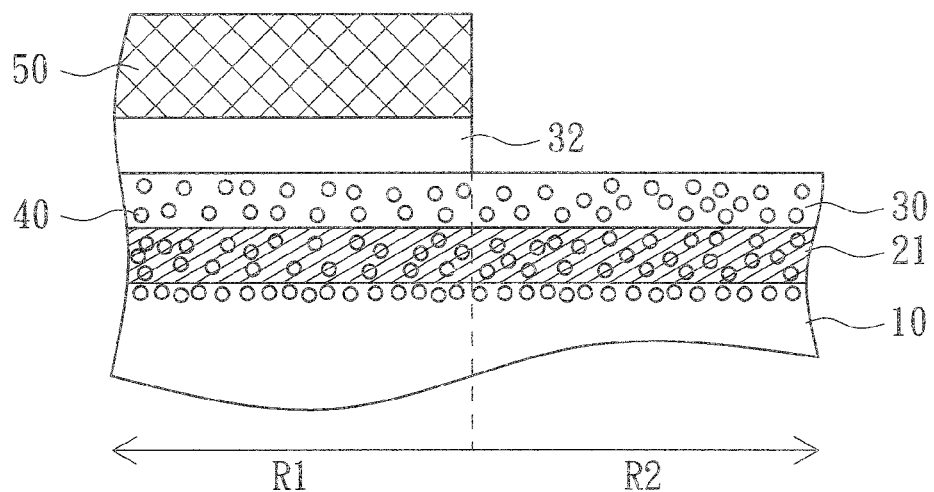
Figure 2E:
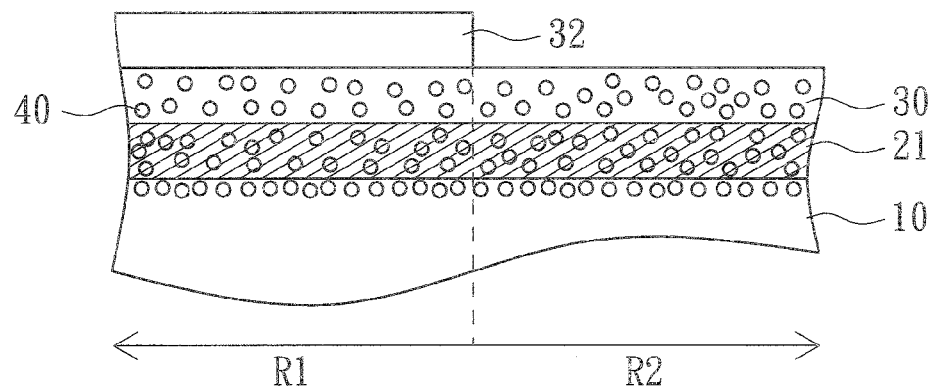
Figure 2F:
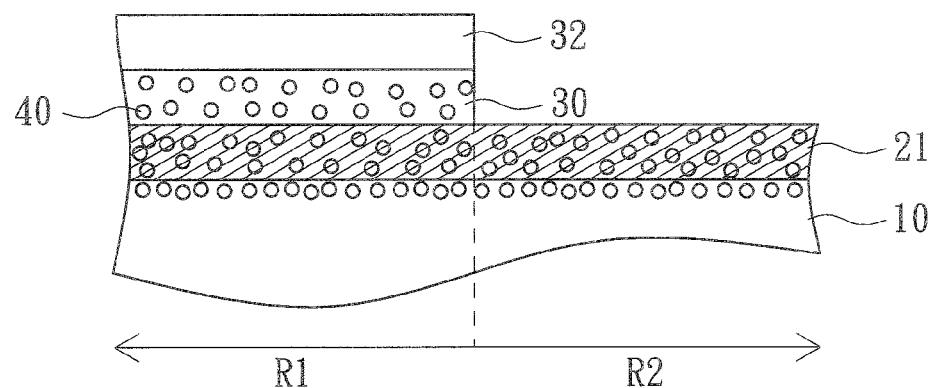
Figure 2G:
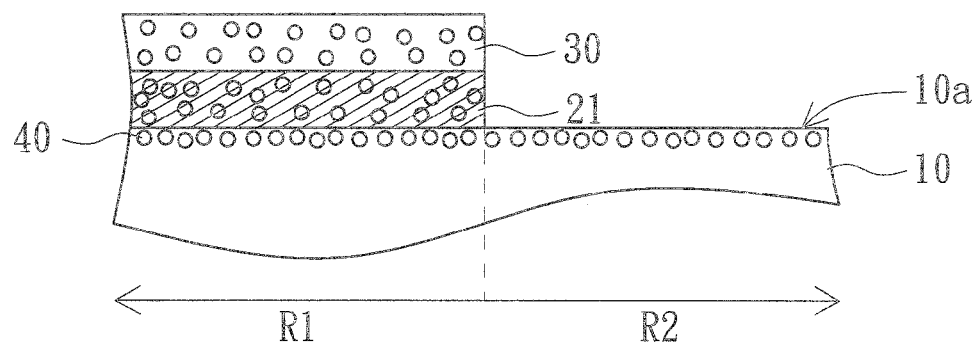

Then, the fabricating method according to the present embodiment enters step S3, the upper oxide layer 32, the nitride layer 30 and the first oxide layer 21 in the second region R2 are removed. Preferably, in step S3, the upper oxide 32 in the first region is removed in the meantime. Step S3 in the present embodiment can be conducted according to the following steps. First, an etching blocking layer 50 is formed over the base 10 in the first region R1, as shown in FIG. 2C. Next, the upper oxide layer 32 in the second region R2 is etched through a first dipping process, as shown in FIG. 2D. In the first dipping process, the upper oxide layer 32 in the second region R2 is wet-etched by using buffered oxide etchant (BOE) or hydrogen fluoride (HF) for example. In the present embodiment, the etching blocking layer 50 is preferably a photo resist for preventing the upper oxide layer 32 in the first region R1 from being etched. After the upper oxide layer 32 in the second region R2 is etched, the etching blocking layer 50 is removed, as shown in FIG. 2E. Afterwards, a second dipping process is performed. In the second dipping process, the nitride layer 30 in the second region R2 is wet-etched by using hot phosphoric acid, as shown in FIG. 2F. The upper oxide layer 32 in the first region R1 is used for preventing the nitride layer 30 in the first region R1 from being etched by the hot phosphoric acid. Later, the first oxide layer 21 in the second region R2 and the upper oxide layer 32 in the first region R1 are removed by a third dipping process, as shown in FIG. 2G. In the present embodiment, the third dipping process is a wet-etching process performed by using buffered oxide etchant or hydrogen fluoride. The nitride layer 30 is used for preventing the first oxide layer 21 in the first region R1 from being etched by the buffered oxide etchant or hydrogen fluoride. As shown in FIG. 2G, after step S3, the first oxide layer 21 and the nitride layer 30 only cover the base 10 in the first region R1. The base 10 has nitride 40 located near the upper surface 10a thereof.

Figure 2H:
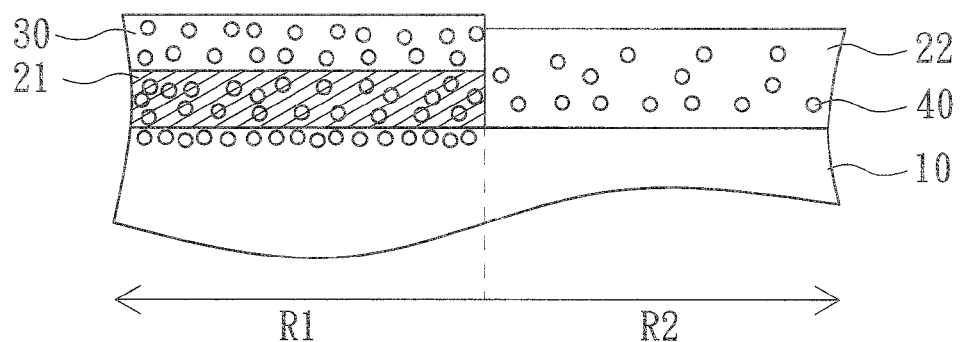

Thereon, the fabricating method proceeds to step S4. A second oxide layer 22 is grown on the base 10 in the second region R2. The second oxide layer 22 can also be formed by way of thermal oxidizing the base 10. The thickness of the second oxide layer 22 is substantially between 50~200 Å. While growing the second oxide layer 22, nitride 40 in the second region R2 moves to the second oxide layer 22, as shown in FIG. 2H.

Figure 2I:
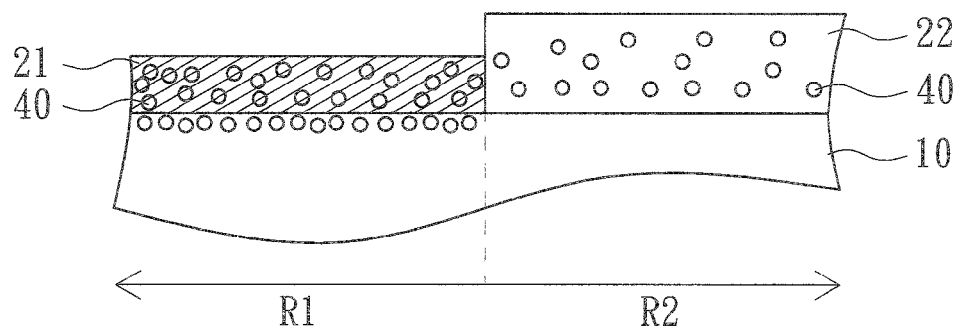

Subsequently, in step S5, the nitride layer 30 in the first region R1 is etched. This step can be performed by a wet-etch process that applies hot phosphoric acid as the etching solution. As shown in FIG. 2I, after the nitride layer 30 in the first region R1 is etched, the first oxide layer 21 covers the base 10 in the first region R1, and the second oxide layer 22 covers the base 10 in the second region R2.

Figure 3:
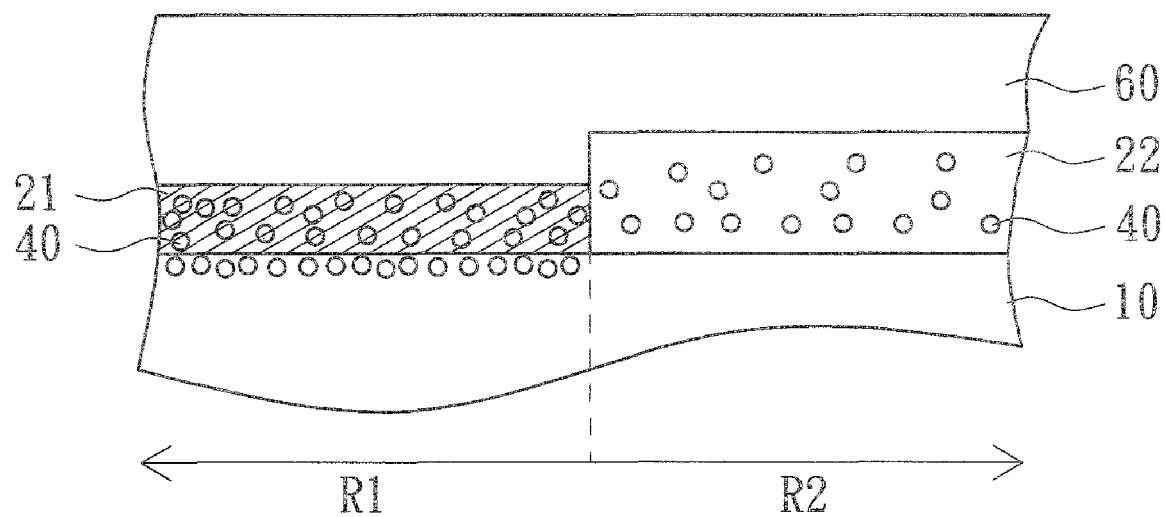
FIG. 3 is a cross-sectional view of the semiconductor device according to the preferred embodiment of the present invention.

The method of fabricating the semiconductor device according to the present embodiment preferably further includes a step of forming a poly-silicon layer 60. The poly-silicon layer 60 is preferably formed on the first oxide layer 21 and the second oxide layer 22 through a chemical vapor deposition (CVD) process. Please refer to FIG. 3. FIG. 3 is a cross-sectional view of the semiconductor device according to the preferred embodiment of the present invention. When the poly-silicon layer 60 is formed on the first oxide layer 21 and the second oxide layer 22, the semiconductor device 100 according to the preferred embodiment of the present invention is complete.

Practically, when the poly-silicon layer 60 is formed on the first oxide layer 21 and the second oxide layer 22, further steps including defining the channel length, implanting ions for forming the source region and the drain region, forming the source contact and the drain contact, and performing metallization process, can be performed. These steps are known by anyone who is skilled in the art and therefore are not described redundantly. A logic device, such as a CMOS, can be constructed from the base 10, the first oxide layer 21 and the poly-silicon layer 60 in the first region R1. The first oxide layer 21 is used as the gate oxide layer of the logic device. Besides that, a non-volatile memory (NVM) device can be constructed from the base 10, the second oxide layer 22 and the poly-silicon layer 60 in the second region R2. The second oxide layer 22 is used as the charge trapping layer of the memory device.

As shown in FIG. 3, nitride 40 in the base 10 in the first region R1 is located near the interface between the base 10 and the first oxide layer 21. Through the bonding of nitride 40 and silicon atoms, the issues regarding quality lowering caused by the dangling bond of the silicon atoms at the surface of the base 10 are resolved. Furthermore, the dielectric property of the gate oxide layer of the logic device is improved through the presence of nitride 40 in the first oxide layer 21. Also, the reliability of the logic device is increased, and the required thickness of the gate oxide layer is reduced. Moreover, nitride 40 in the second oxide layer 22 provide the second oxide layer 22 with uniform charge traps, which can be applied for programming or erasing the non-volatile memory device. For example, the memory device can be subjected to the operations of Fowler-Nordheim tunneling, hot carrier ejection (HCE) and band-to-band tunneling (BTBT). Furthermore, nitride 40 in the second oxide layer 22 forms deep charge traps. As a result, charges are still retained under small electric field, thus improving the data retention property of the memory device.

In the present embodiment, before the ion implantation of the source region and the drain region is performed, nitride 40 moves to the first oxide layer 21 and the vicinity of the upper surface 10a (the upper surface is illustrated in FIG. 2G) of the base 10 by thermal oxidizing the nitride layer 30 at high temperature. Also, nitride 40 is provided into the second oxide layer 22 in the meantime of growing the second oxide layer 22. In other words, before ion implantation is performed, the nitridation of the first oxide layer 21 and the second oxide layer 22 is conducted in advance. As a result, the strength of the first oxide layer 21 and the second oxide layer 22 is enhanced, and the surface property of the base 10 is improved at the same time. Damage caused by ion implantation of the source region and the drain region is reduced. Therefore, the quality of the semiconductor device 100 and operation stability are both improved.

In the semiconductor device and the method of fabricating the same according to the preferred embodiment of the present invention, the first oxide layer and the second oxide layer are formed on the base, and the poly-silicon layer is formed on the first oxide layer and the second oxide layer. The first oxide layer is used as the gate oxide layer of the logic device in the semiconductor device. Because the first part of nitride is located in the first oxide layer, the strength and the dielectric property of the first oxide layer are improved. The stability in operating the logic device is increased accordingly. Furthermore, the second part of nitride is located in the base near the interface between the base and the first oxide layer, so damage to the surface of the base in the subsequent processes is reduced, which increases the reliability of the logic device. Moreover, the third part of nitride is located in the second oxide layer for providing the second oxide layer with several charge traps. Therefore, the non-volatile memory device in the semiconductor device can be erased, programmed and read in a conventional way, and data retention property is improved. In the semiconductor device according to the preferred embodiment of the present invention, the first oxide layer and the second oxide layer, applied to the logic device and the non-volatile memory device respectively, are formed in the same process. As a result, the manufacturing steps are simplified, and the time and cost of the manufacturing process are reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a semiconductor device, the method comprising:
   forming a first oxide layer and a nitride layer on a base, the base having a first region and a second region;
   oxidizing the nitride layer, an upper portion of the nitride layer converted to an upper oxide layer;
   removing the upper oxide layer, the nitride layer and the first oxide layer in the second region and the upper oxide layer in the first region after the step of oxidizing the nitride layer; and
   growing a second oxide layer on the base in the second region after the removing step.

2. The method according to claim 1, wherein the step of oxidizing the nitride layer comprises:
   oxidizing the nitride layer through a high-temperature thermal process performed at a high temperature between 800-1200° C.

3. The method according to claim 1, wherein the removing step comprises:
   forming an etching blocking layer over the base in the first region;
   first dipping out the upper oxide layer in the second region;
   removing the etching blocking layer;
   second dipping out the nitride layer in the second region; and
   third dipping out the first oxide layer in the second region.

4. The method according to claim 3, wherein the step of first dipping comprises:
   wet-etching the upper oxide layer in the second region by using buffered oxide etchant (BOE) or hydrogen fluoride (HF).

5. The method according to claim 3, wherein the step of second dipping comprises:
   wet-etching the nitride layer in the second region by using hot phosphoric acid.

6. The method according to claim 3, wherein the step of third dipping comprises:
   wet-etching the first oxide layer in the second region by using buffered oxide etchant (BOE) or hydrogen fluoride (HF).

7. The method according to claim 3, wherein in the step of third dipping, the upper oxide layer in the first region is removed.

8. The method according to claim 1, wherein the step of growing the second oxide layer comprises:
   thermal oxidizing the base.

9. The method according to claim 1, wherein the method further comprises:
   etching the nitride layer in the first region.

10. The method according to claim 9, wherein the step of etching the nitride layer in the first region comprises:
    wet-etching the nitride layer in the first region by using hot phosphoric acid.

11. The method according to claim 1 further comprising:
    forming a poly-silicon layer on the first oxide layer and the second oxide layer after the etching step.

12. The method according to claim 1, wherein in the step of forming the first oxide layer and the nitride layer, the thickness of the first oxide layer is substantially 5-100 Å (angstrom).

13. The method according to claim 1, wherein in the step of oxidizing the nitride layer, the thickness of the upper oxide layer is substantially equal to or less than 100 Å.

14. The method according to claim 1, wherein in the step of growing the second oxide layer, the thickness of the second oxide layer is substantially 50-200 Å.

15. The method according to claim 1, wherein nitride is nitrogen or nitride silicon.

16. A method of fabricating a semiconductor device, the method comprising:
    forming a first oxide layer and a nitride layer on a base, the base having a first region and a second region;
    oxidizing the nitride layer, an upper portion of the nitride layer converted to an upper oxide layer;
    forming an etching blocking layer over the base in the first region;
    first dipping out the upper oxide layer in the second region;
    removing the etching blocking layer;
    second dipping out the nitride layer in the second region;
    third dipping out the first oxide layer in the second region; and
    growing a second oxide layer on the base in the second region.

17. The method according to claim 16, wherein the step of first dipping comprises:
    wet-etching the upper oxide layer in the second region by using buffered oxide etchant (BOE) or hydrogen fluoride (HF).

18. The method according to claim 16, wherein the step of second dipping comprises:
    wet-etching the nitride layer in the second region by using hot phosphoric acid.

19. The method according to claim 16, wherein the step of third dipping comprises:
    wet-etching the first oxide layer in the second region by using buffered oxide etchant (BOE) or hydrogen fluoride (HF).

20. The method according to claim 16, wherein in the step of third dipping, the upper oxide layer in the first region is removed.

21. The method according to claim 16, wherein the step of growing the second oxide layer comprises:
    thermal oxidizing the base.

22. The method according to claim 16, wherein the method further comprises:
    etching the nitride layer in the first region.

23. The method according to claim 22, wherein the step of etching the nitride layer in the first region comprises:
    wet-etching the nitride layer in the first region by using hot phosphoric acid.

24. The method according to claim 16 further comprising:
    forming a poly-silicon layer on the first oxide layer and the second oxide layer after the etching step.

* * * * *